United States Patent [19]
Fung et al.

[11] Patent Number: 5,748,552
[45] Date of Patent: May 5, 1998

[54] DRAM IMPLEMENTATION FOR MORE EFFICIENT USE OF SILICON AREA

[75] Inventors: Michael G. Fung, Los Altos Hills; Paul M-Bhor Chiang, Cupertino, both of Calif.

[73] Assignee: Silicon Magic Corporation, Santa Clara, Calif.

[21] Appl. No.: 703,388

[22] Filed: Aug. 26, 1996

[51] Int. Cl.$^6$ ............................................. G11C 8/00

[52] U.S. Cl. .................. 365/230.03; 365/51; 365/63; 365/69

[58] Field of Search ................. 365/51, 63, 69, 365/206, 230.03

[56] References Cited

U.S. PATENT DOCUMENTS 5,457,648  10/1995  Eisig .................................. 365/51

Primary Examiner—David C. Nelms
Assistant Examiner—Hoai V. Ho
Attorney, Agent, or Firm—Sawyer & Associates

[57] ABSTRACT

A system and method for a dynamic random access memory. The dynamic random access memory further comprises a memory block and a plurality of data lines. The memory block further comprises a plurality of memory cells. The plurality of memory cells are arranged into a plurality of rows and a plurality of columns. The plurality of data lines is proportional to the plurality of columns. Each of the plurality of data lines is substantially parallel to the plurality of columns.

17 Claims, 5 Drawing Sheets

5,748,552

DRAM IMPLEMENTATION FOR MORE EFFICIENT USE OF SILICON AREA

FIELD OF THE INVENTION

The present invention relates to a method and system for a dynamic random access memory ("DRAM") and more particularly to a method and system for implementing a DRAM which provides increased efficiency in the required area for the DRAM and the power consumption of the DRAM.

BACKGROUND OF THE INVENTION

A standard dynamic random access memory ("DRAM") is organized into blocks. Each block is typically comprised of rows and columns of memory cells. The rows which are driven by circuitry outside the memory cell block are also referred to as word lines. The columns, along which data flows into and out of memory cells, are also referred to as bit lines. Conventional DRAMs have significantly more columns than rows in each block. A conventional DRAM, for example, may have 1024 columns and 256 rows in each block. The input/output lines for each block, the data lines, run parallel to the rows.

To access the data stored in one block of the DRAM, an entire row of memory cells is typically accessed. The data in the row is transferred to a set of sense amplifiers. The number of sense amplifiers is typically the same as the number of columns. A secondary multiplexer is then used to select a particular number of bits, typically four or eight bits, for delivery during one clock cycle. The bits are delivered by the data lines which run parallel to the rows.

In some applications, a greater number of bits must be delivered from memory during each clock cycle. When a greater number of bits per clock cycle must be delivered, for example 128 bits, a greater number of data lines is required. Consequently, the area of the block is increased by the area required for each additional data line. When a large number of bits per cycle are to be delivered, the area required for each block is significantly increased. However, because smaller circuits are preferred, it is desirable to minimize the area of each block of the DRAM. A system requiring a large number of bits per clock cycle, therefore, cannot be implemented in a relatively small area by using this method.

Another conventional method of implementing a DRAM delivering a large number of bits per clock cycle uses fewer data lines per block, but activates several blocks during the clock cycle. Consequently, less area per block is required. However, this conventional DRAM consumes significantly more power than other conventional DRAMs. Moreover, the total area of the entire system would still be relatively large, since multiple blocks are used.

Accordingly, what is needed is a system and method for a dynamic random access memory ("DRAM") which utilizes a relatively small area without consuming significant additional power. The present invention addresses such a need.

SUMMARY OF THE INVENTION

The present invention provides a method and system for a dynamic random access memory. The dynamic random access memory comprises a memory block and a plurality of data lines. The memory block further comprises a plurality of memory cells. The plurality of memory cells are arranged into a plurality of rows (also known as word lines) and a plurality of columns (also known as bit lines). The plurality of data lines is proportional to the plurality of columns. Each of the plurality of data lines is substantially parallel to the plurality of columns.

According to the system and method disclosed herein, the present invention is capable of using less area and consuming less power than conventional DRAMs delivering the same number of bits per cycle, thereby increasing overall system performance.

DESCRIPTION OF THE INVENTION

The present invention relates to an improvement in dynamic random access memory ("DRAM"). The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
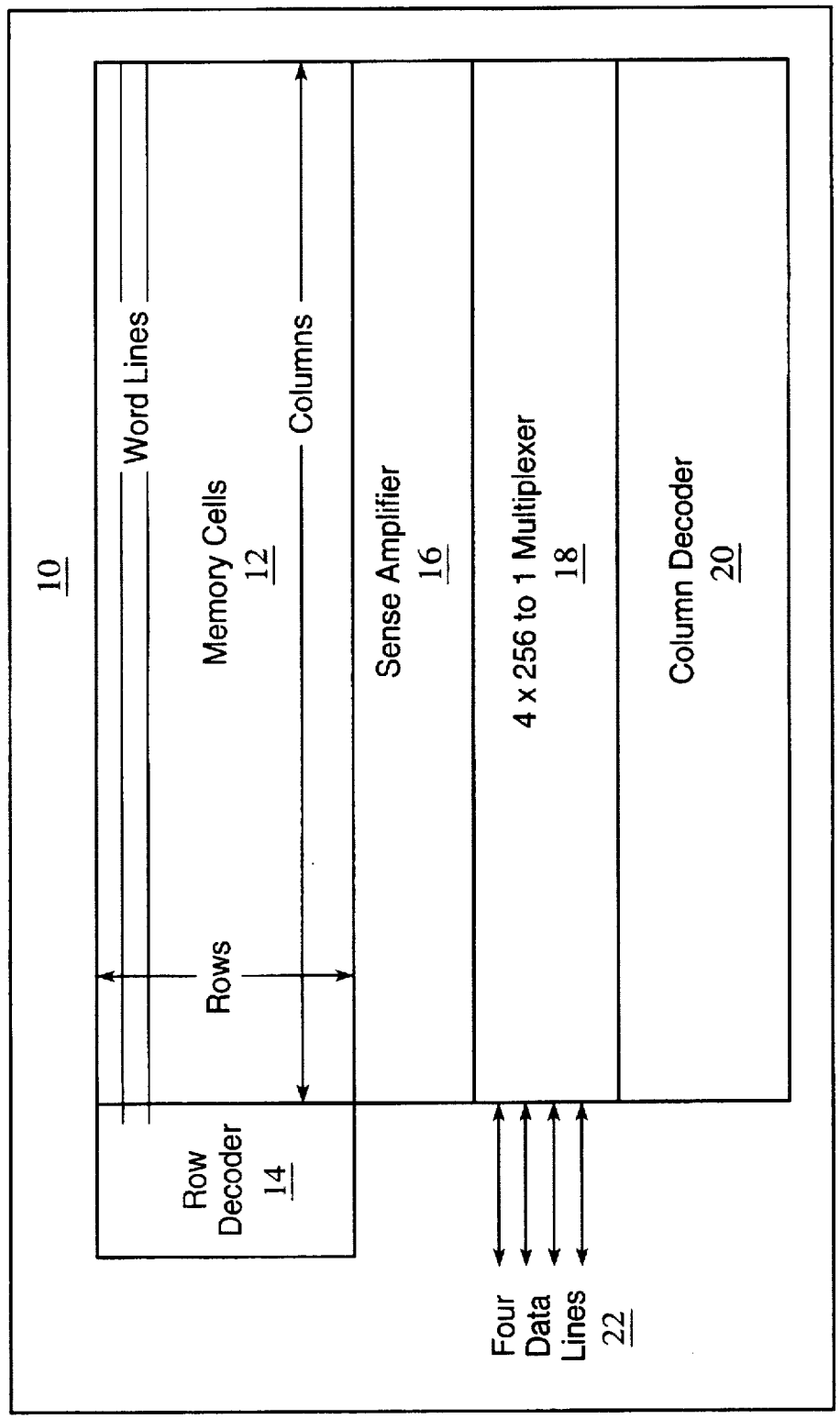
FIG. 1 is a block diagram of a typical block in a conventional DRAM with four data lines.

FIG. 1 is a block diagram of a typical block in a conventional dynamic random access memory ("DRAM") with four data lines. Each block is typically comprised of a memory cell array 12, row decoder 14, sense amplifiers 16, multiplexer 18, column decoder 20, and data lines 22. The memory cell array 12 is comprised of rows and columns. Typical DRAMs have significantly more columns than rows in each block. The DRAM block 10 depicted in FIG. 1 has 256 rows and 1024 columns. The rows are also known as the word lines. The columns are also known as the bit lines. The DRAM block 10 of FIG. 1 has four data lines 22. The data lines 22 run parallel to the rows in typical DRAM block 10. In addition, the number of data lines 22 can be varied.

When the data stored in one block of the DRAM is to be accessed, row decoder 14 activates one row of the 256 rows in the memory cell array 12. Thus, an entire row of memory cells is typically accessed. The data in the selected row of cells is transferred to the set of sense amplifiers 16. Conventional DRAM blocks 10 possess one sense amplifier for every column. Consequently, there are 1024 sense amplifiers in the set of sense amplifiers 16. The secondary multiplexer 18 is then used to select a particular number of bits to be delivered over data lines 22. Because there are four data lines 22, the DRAM block depicted in FIG. 1 can deliver four bits during one clock cycle.

Figure 2:
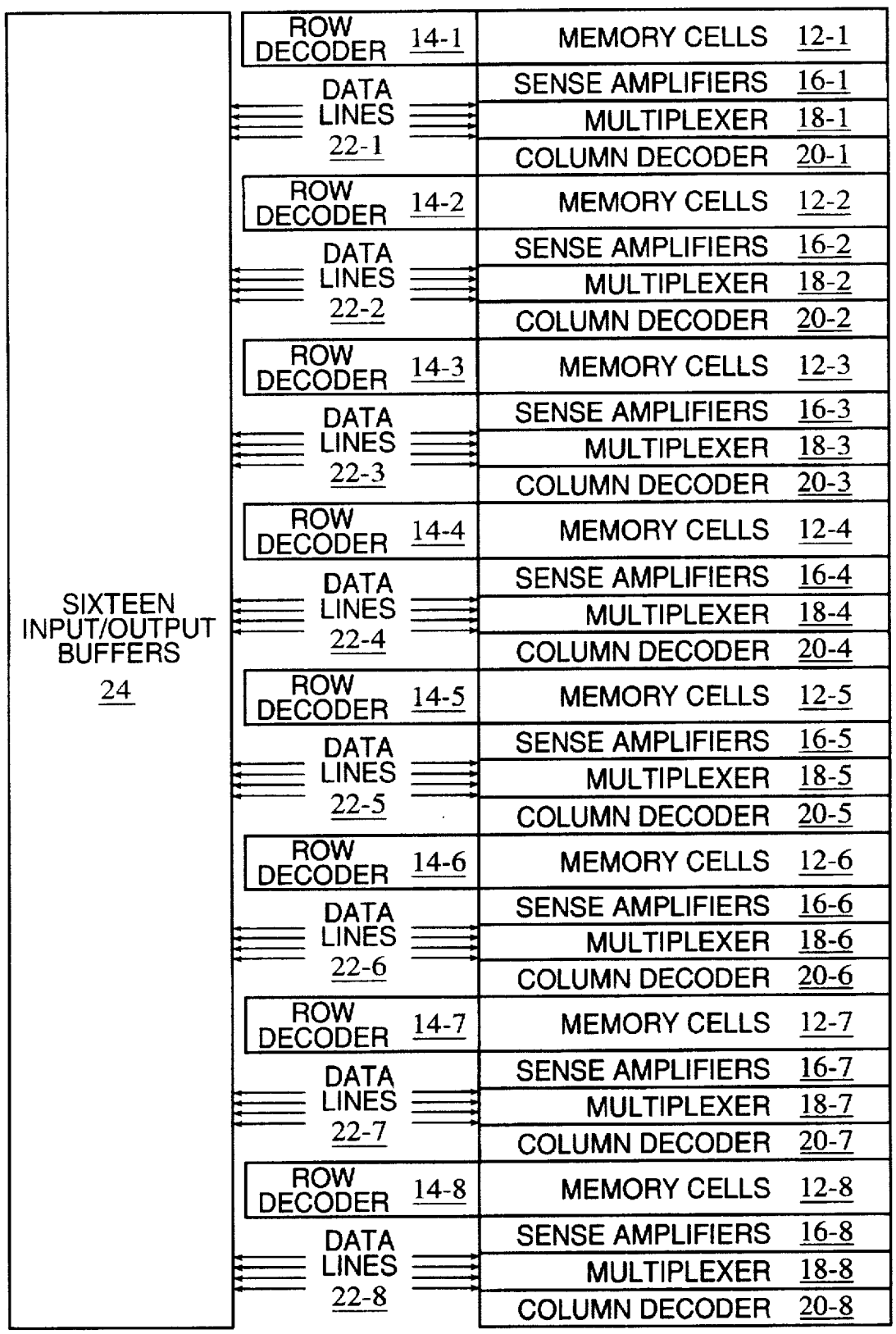
FIG. 2 is a is a block diagram depicting a conventional DRAM array comprised of a plurality of typical DRAM blocks.

FIG. 2 displays an array 30 of eight DRAM blocks 10 (FIG. 1). Each block in the array 30 is identical to the DRAM block 10 depicted in FIG. 1. Referring now to FIG. 2, the column decoder for each block, 20-1 through 20-8, chooses one column to be output to each data line, 22-1 through 22-8, for the block. The input/output ("I/O") buffer 24 selects which set or sets of data lines of 22-1 through 22-8 is to be output. Like the DRAM block 10 of FIG. 1, each block of the array 30 also delivers only four bits per clock cycle.

Figure 3:
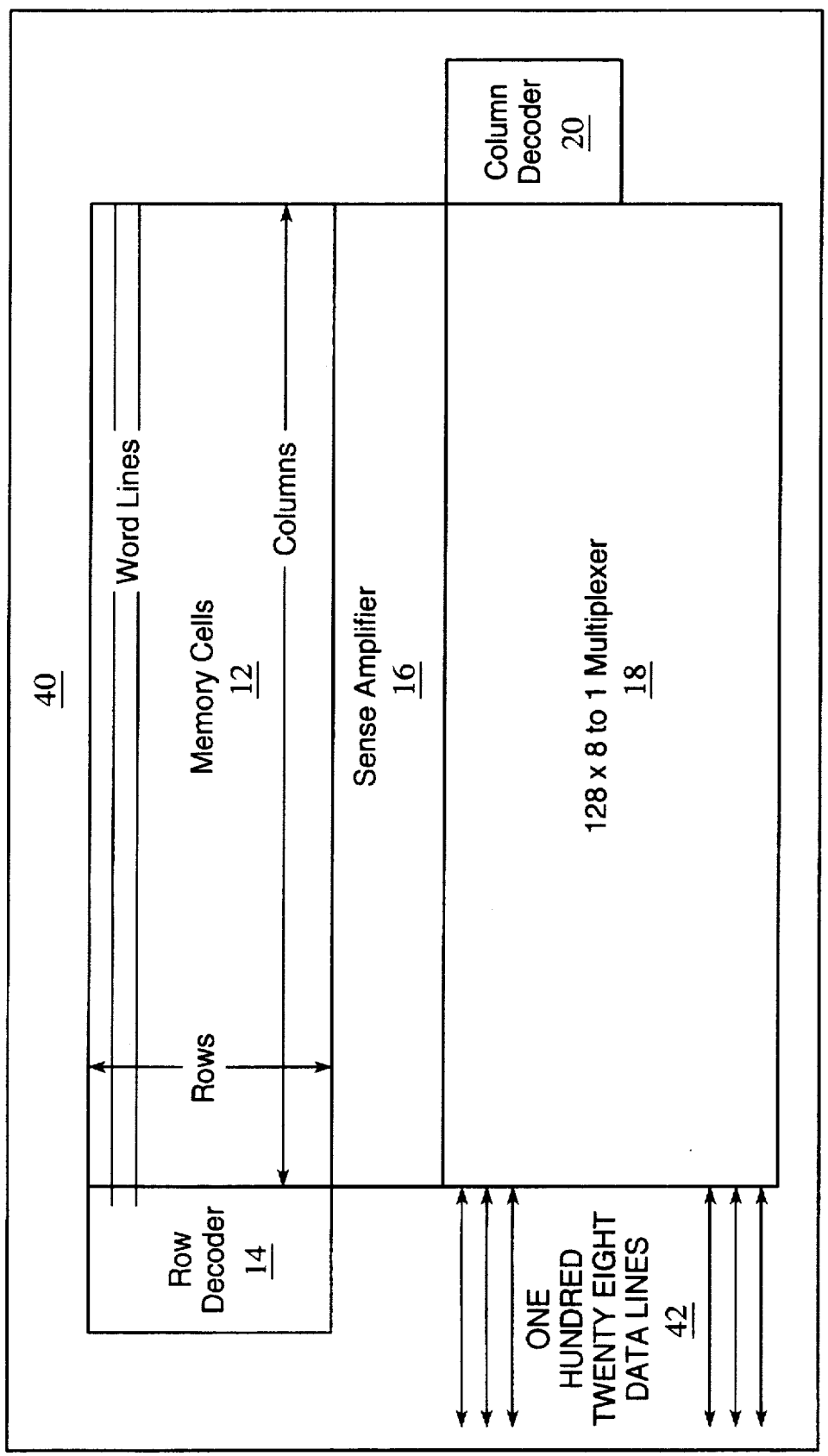
FIG. 3 is a block diagram of a typical block in conventional DRAM with 128 data lines.

If a greater number of bits must be delivered from memory during each clock cycle, for example 128 bits, two conventional methods of implementing such a DRAM are typically used. One method delivers 128 bits from a single accessed row. This conventional implementation is shown in FIG. 3. The DRAM block 40 in FIG. 3 is identical to DRAM block 10 of FIG. 1, except that one hundred and twenty eight data lines 42 are output from the DRAM block 40. The data lines 42 run parallel to the rows. Consequently, the area of the DRAM block 40 is increased by the area required for each additional data line. When such a large number of bits per cycle are to be delivered and the data lines 42 are parallel to the rows, the area required for each block is significantly increased. Although this conventional implementation will function, those with ordinary skill in the art will realize that the because smaller circuits are preferred, it is desirable to minimize the area of each block 40. A system requiring a large number of bits per clock cycle, therefore, will be difficult to achieve in a relatively small area.

A second conventional method for implementing a DRAM which can output a greater number of bits per clock cycle uses multiple blocks similar to block 10 of FIG. 1. Thus fewer data lines per block are utilized than in the block 40 depicted in FIG. 3. Instead of using a large number of data lines for each block, the second method delivers fewer bits per block from several DRAM blocks. Because fewer data lines 22 are required for each block 10, the second method uses less area per block.

For example, if 128 bits are to be delivered during each clock cycle, an array of eight blocks similar to that shown in FIG. 2 is used. In such a system, sixteen bits can be taken from each of the eight blocks 10. Thus, sixteen data lines 22 from each DRAM block are required instead of 128 data lines 42 shown in FIG. 3. Because only 16 data lines 22 would be used for each block 10, the required area per block is reduced.

However, those with ordinary skill in the art will realize that the majority of power consumption by the DRAM arises from selecting the blocks 10 and from activating the sense amplifiers 16. Those with ordinary skill in the art will also know that it is desirable to minimize the power consumed by the DRAM. The second conventional implementation, however, uses significantly more power than the first. For example, where sixteen bits are delivered from each of eight blocks 10, for a total of 128 bits, all eight blocks 10 must be turned on at one time. Because eight blocks rather than one block are turned on, eight times the power is required. Thus, the second method significantly increases the power consumption of the DRAM. Moreover, the second method still requires a relatively large area for the entire system because multiple blocks are used.

The present invention provides for a method and system for implementing a DRAM which can deliver a large number of bits per clock cycle while reducing the area required and power consumed over traditional DRAMs. The present invention will be described in terms of a DRAM delivering 128 bits of data. However, one of ordinary skill in the art will readily recognize that this method and system will operate effectively for other types of memory and either fewer or more bits can be delivered per clock cycle.

Figure 4:
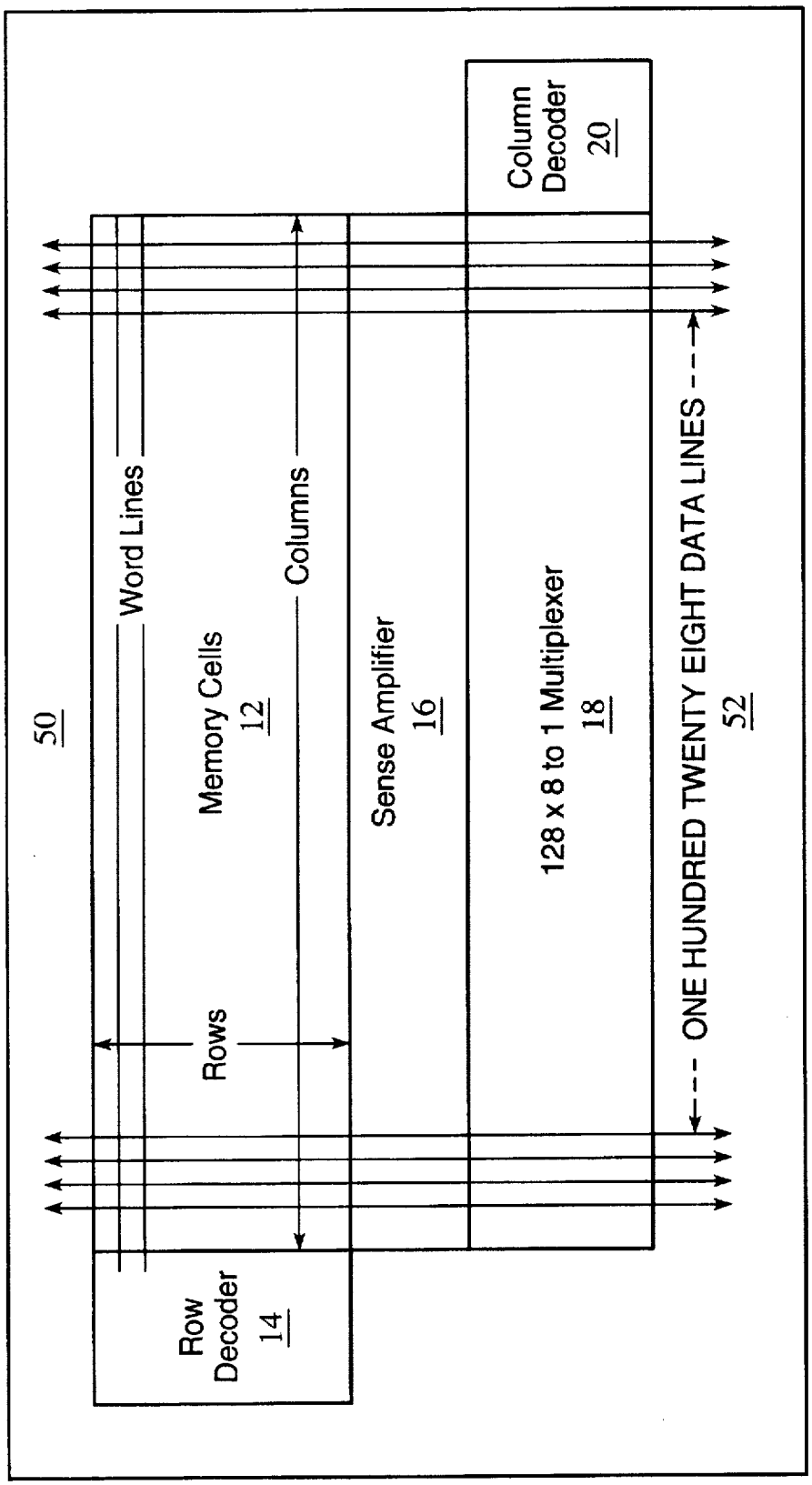
FIG. 4 is a block diagram of a DRAM block in accordance with one embodiment of the method and system.

To more particularly illustrate the method and system in accordance with the present invention, refer now to FIG. 4 depicting a block diagram of one embodiment of a portion of such a system. The DRAM block 50 displayed in FIG. 4 is comprised of a memory cell array 12, row decoder 14, sense amplifiers 16, multiplexer 18, column decoder 20, and data lines 52. Memory cell array 12 is comprised of 256 rows or word lines, and 1024 columns, or bit lines. DRAM block 50 differs from DRAM block 10 depicted in FIG. 1 primarily in the position of column decoder 20 and the orientation of data lines 52. Unlike the data lines 22 in DRAM block 10 of FIG. 1, the data lines 52 of DRAM block 50 in FIG. 5 run parallel to the direction of the columns instead of the rows of memory cell array 12. Because data lines 52 are parallel to the columns of memory cell array 12, the additional space used by conventional methods to deliver more bits per clock cycle is not required by the method and system. Consequently, the method and system require significantly less area in order to deliver a large number of bits compared to conventional methods and systems.

Figure 5:
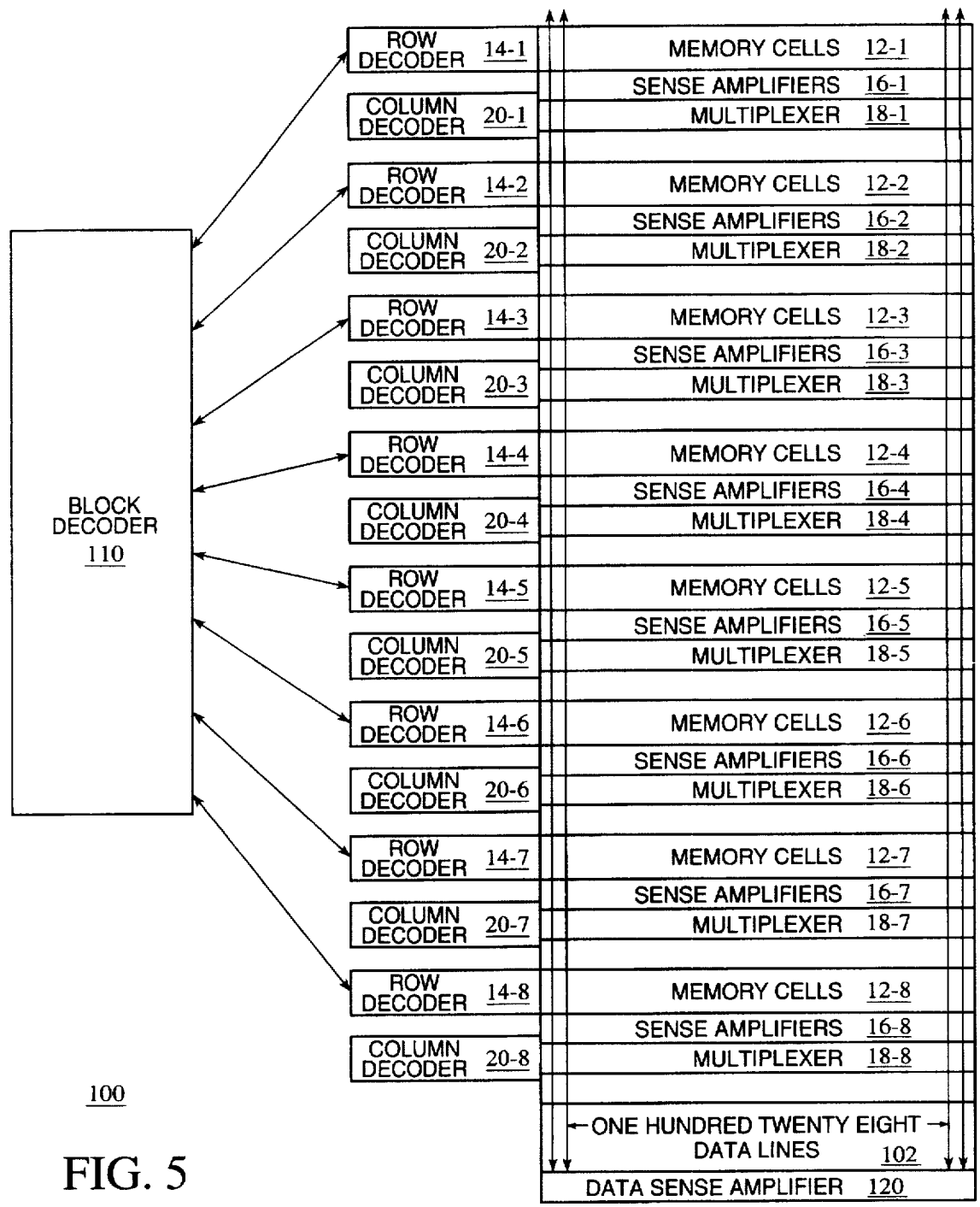
FIG. 5 is a block diagram depicting a DRAM array in accordance with one embodiment of the method and system.

FIG. 5 depicts one embodiment of an array 100 of eight DRAM blocks 50 (FIG. 4) in accordance with the method and system. The array 100 is capable of delivering one hundred and twenty eight bits per clock cycle. All 128 bits are delivered through bus 102 to data sense amplifiers 120. In the array 50, 100, the block decoder 110 selects which block 50 will be activated in order to deliver the bits. In the embodiment shown in FIG. 5, only one block 50 is activated during one clock cycle. Because only one block is activated, significantly less power is utilized than in conventional methods and systems which activate greater than one block per clock cycle.

A method and system has been disclosed for implementing a DRAM having data lines which are parallel to the columns of the memory cells. Because of the orientation of the input/output data lines, the DRAM is capable of outputting a large number of bits during a single clock cycle while utilizing significantly less area and power than conventional DRAMs. Consequently, overall system performance is improved.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A dynamic random access memory comprising:
   a memory block, the memory block further comprising a plurality of memory cells, the plurality of memory cells being arranged into a plurality of rows and a plurality of columns; and
   a plurality of data lines proportional to the number of columns, each of the plurality of data lines being substantially parallel to the plurality of columns;
   a row decoder coupled to the plurality of rows, for selecting one row of the plurality of rows for output; and
   a column decoder coupled to the plurality of data lines, for selecting a portion of the plurality of columns for output,
   such that a portion of the plurality of memory cells is selected for output.

2. The dynamic random access memory of claim 1 wherein the plurality of data lines further comprises at least 32 data lines.

3. The dynamic random access memory of claim 1 further comprising a plurality of sense amplifiers, each of the plurality of sense amplifiers being coupled to each of the plurality of columns, each sense amplifier for determining the state of a selected memory cell.

4. A dynamic random access memory comprising:

a plurality of blocks each block of the plurality of blocks comprising:

a memory block, the memory block further comprising a plurality of memory cells, the plurality of memory cells being arranged into a plurality of rows and a plurality of columns:

a plurality of data lines with each of the plurality of data lines being substantially parallel to the plurality of columns in the plurality of memory blocks;

a row decoder coupled to the plurality of rows, for selecting one row of the plurality of rows for output; and a column decoder coupled to the plurality of data lines, for selecting a a portion of the plurality of columns for output, such that a portion of the plurality of memory cells is selected for output.

5. The dynamic random access memory of claim 4 wherein the plurality of data lines further comprises at least 32 data lines.

6. The dynamic random access memory of claim 5 further comprising a block decoder coupled to each of the plurality of blocks, the block decoder for selecting one of the plurality of blocks for activation.

7. The dynamic random access memory of claim 4 further comprising a plurality of sense amplifiers, each of the plurality of sense amplifiers being coupled to each of the plurality of columns, each sense amplifier for determining the state of a selected memory cell of the portion of the plurality of memory cells.

8. A method of implementing a dynamic random access memory comprising the steps of:

a) providing a memory block, the memory block further comprising a plurality of memory cells:

b) arranging the plurality of memory cells into a plurality of rows and a plurality of columns:

c) providing a plurality of data lines proportional to the number of columns, each of the plurality of data lines being arranged substantially parallel to the plurality of columns;

d) providing a row decoder coupled to the plurality of rows, the row decoder for selecting one row of the plurality of rows for output; and e) providing a column decoder coupled to the plurality of data lines, for selecting a a portion of the plurality of columns for output, such that a portion of the plurality of memory cells is selected for output.

9. The method of claim 8 wherein step (c), providing a plurality of data lines, further comprises the step of providing at least 32 data lines.

10. The method of claim 8 further comprising the step of:

f) providing a plurality of sense amplifiers, each of the plurality of sense amplifiers being coupled to each of the plurality of columns, each sense amplifier for determining the state of a selected memory cell.

11. A method for providing a dynamic random access memory comprising the steps of:

a) providing a plurality of blocks each block of the plurality of blocks further comprising a memory block, the memory block further comprising a plurality of memory cells:

b) for each memory block, arranging the plurality of memory cells into a plurality of rows and a plurality of columns; and c) providing a plurality of data lines, each of the plurality of data lines being substantially parallel to the plurality of columns in the plurality of memory blocks, wherein block providing step (a) further comprises the steps of: a1) providing a row decoder coupled to the plurality of rows, the row decoder for selecting one row of the plurality of rows for output; and a2) providing a column decoder coupled to the plurality of data lines and the plurality of columns, the column decoder for selecting a portion of the plurality of the columns for output, such that a portion of the plurality of memory cells is selected for output.

12. The method of claim 11 wherein step (c), providing a plurality of data lines further comprises the step of providing at least 32 data lines.

13. The method of claim 12 further comprising the steps of:

d) providing a block decoder, the block decoder being coupled to each of the plurality of blocks, the block decoder for selecting one of the plurality of blocks for activation.

14. The method of claim 11 further comprising the steps of:

e) providing a plurality of sense amplifiers, each of the plurality of sense amplifiers being coupled to each of the plurality of columns, each sense amplifier for determining a state of a selected memory cell of the portion of the plurality of memory cells.

15. A method for providing a dynamic random access memory comprising the steps of:

a) providing a plurality of blocks, b) for each block of the plurality of blocks, providing a memory block, the memory block further comprising a plurality of memory cells, c) for each block, arranging the plurality of memory cells into a plurality of rows and a plurality of columns;

d) orienting the plurality of columns of each block to be substantially parallel;

e) providing a plurality of data lines of at least 32 data lines, each of the plurality of data lines being substantially parallel to the plurality of columns in the plurality of data blocks; and f) providing a block decoder coupled to each of the plurality of blocks, the block decoder for selecting one of the plurality of blocks for activation.

16. The method of claim 15 wherein block providing step (a) further comprises the steps of:

a1) providing a row decoder coupled to the plurality of rows for each block, each row decoder for selecting one row of the plurality of rows for output; and a2) providing a column decoder coupled to the plurality of data lines and the plurality of columns for each block, the column decoder for selecting a portion of the plurality of columns for output, such that a portion of the plurality of memory cells is selected for output.

17. The method of claim 16 further comprising the step of:

g) providing a plurality of sense amplifiers, each of the plurality of sense amplifiers being coupled to each of the plurality of columns, each sense amplifier for determining the state of a selected memory cell of the portion of the plurality of memory cells.

* * * * *